United States Patent [19]
Ando et al.

[11] Patent Number: 6,082,428
[45] Date of Patent: Jul. 4, 2000

[54] PART SUPPLYING DEVICE

[75] Inventors: Takashi Ando, Kofu; Mamoru Inoue, Hirakata, both of Japan

[73] Assignee: Matsushita Electric Industrial Co., Ltd., Osaka, Japan

[21] Appl. No.: 09/091,855

[22] PCT Filed: Dec. 26, 1996

[86] PCT No.: PCT/JP96/03804

§ 371 Date: Jun. 25, 1998

§ 102(e) Date: Jun. 25, 1998

[87] PCT Pub. No.: WO97/24912

PCT Pub. Date: Jul. 10, 1997

[30] Foreign Application Priority Data

Dec. 28, 1995 [JP] Japan ................................. 7-342822

[51] Int. Cl.⁷ .................................................. B65H 5/28
[52] U.S. Cl. .......................... 156/584; 156/344; 221/25; 221/87; 414/411; 414/416
[58] Field of Search .................... 156/344, 584; 221/25, 72, 73, 79, 87; 226/8, 120; 414/411, 416

[56] References Cited

U.S. PATENT DOCUMENTS 4,494,902  1/1985  Kuppens et al. ................ 156/584 X
4,869,393  9/1989  Soth ................................. 156/584 X

FOREIGN PATENT DOCUMENTS 57-146399  9/1982  Japan .
64-24900   2/1989  Japan .
7-38286    2/1995  Japan .

*Primary Examiner*—Mark A. Osele
*Attorney, Agent, or Firm*—Wenderoth, Lind & Ponack, L.L.P.

[57] ABSTRACT

The present invention is intended to feed components stably and speedily in a component feed apparatus whereby components stored in the form of a taped component, while being transferred along a component feed guide, are sequentially supplied to a predetermined position to be mounted to a printed board. In order to accomplish the object, a magnet is set in the vicinity of a slit of a component feed guide at which a covering tape is separated from the taped component. The magnet magnetically attracts the component, to thereby prevent the component from being forcibly dragged together with the covering tape when the covering tape is separated. Quick and stable supply of the component can be accordingly ensured.

14 Claims, 6 Drawing Sheets

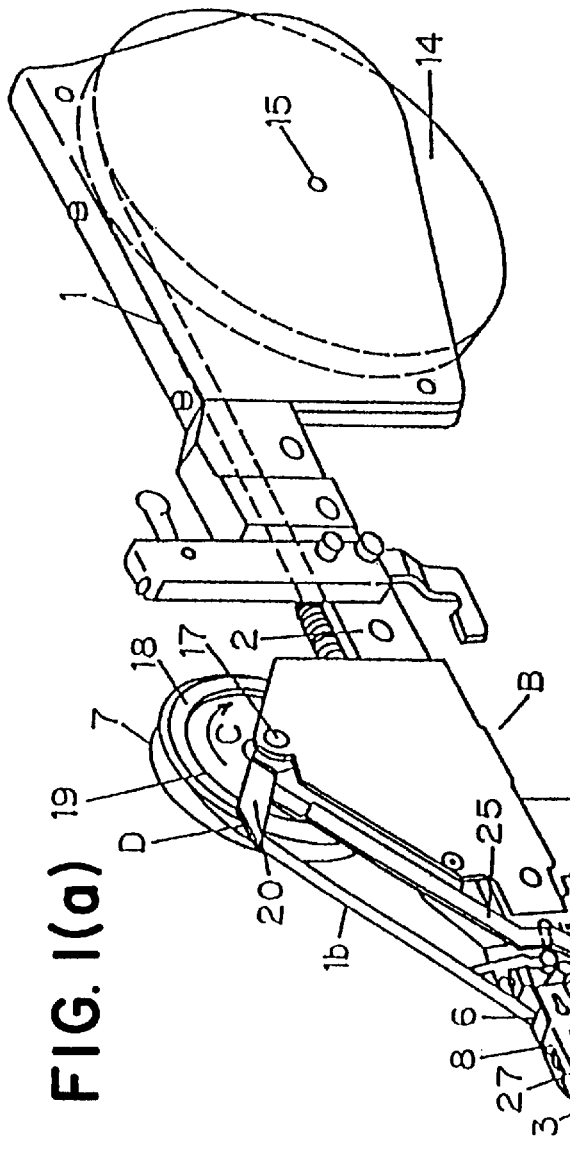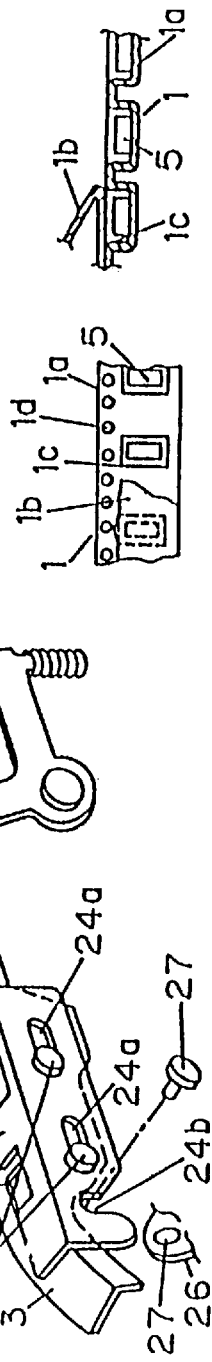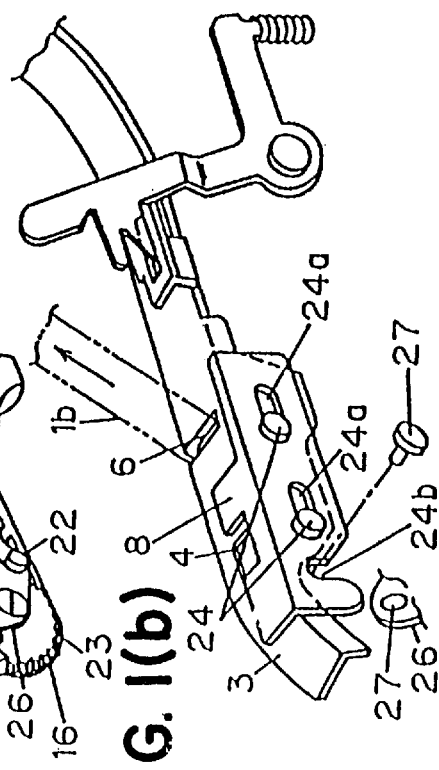

PART SUPPLYING DEVICE

TECHNICAL FIELD

The present invention relates to a component feed apparatus and more particularly, to a component feed apparatus fit for various kinds of usage, e.g., wherein a taping-component, i.e., a taped component (or component tape) accommodating components at a predetermined pitch in a longitudinal direction of a tape, is moved along a component feed guide to thereby sequentially supply the components to a predetermined position for mounting to an electronic circuit board.

BACKGROUND ART

A conventional component feed apparatus will be described with reference to FIGS. 1(a)–(d) and 2. 1 denotes a taped component (or component tape) which consists of component accommodating sections 1c for storing components 5 at a predetermined pitch (internal) in a longitudinal direction of a tape 1a, and a covering tape 1b covering the component accommodating sections 1c. The taped component 1 is drawn out along an upper face of a component feed guide 2 and moved to a component feed port 4 of a retainer cover 3 hanging over a front end part of the component feed guide 2. During the transfer, the taped component 1 is drawn out through a slit 6 notched from one side of the retainer cover 3 in front of the component feed port 4 and wound onto a reel 7 after the covering tape 1b is separated from the tape 1a. The tape 1a is consequently sent to the component feed port 4, with the component accommodating sections 1c exposed. However, the exposed component accommodating sections 1c are covered with the retainer cover 3, so that the components can be stably fed to the component feed port 4 without popping out.

The retainer cover 3 has a shutter 8 for preventing components 5 from popping outside unexpectedly. The shutter 8 is set in a manner to open and close an upper face of the component feed port 4 in association with an operation of feeding the components 5. Only when the components are to be removed by a suction nozzle 10 or the like, the shutter 8 is opened to allow the component to be removed by suction of the suction nozzle 10 in a proper attitude.

In the component feed apparatus constituted as above, the component 5 crackles with annoying static elasticity when the covering tape 1b is drawn out from the slit 6 formed in the retainer cover 3 and wound onto the reel 7, as illustrated in FIG. 6(a). As a result, the component 5 is extracted and levitates out from the component accommodating section 1c as the covering tape 1b is wound up. Particularly in the case of a considerably minute component (for instance, having dimensions smaller than 1.0 mm in length and 0.5 mm in breadth), the component 5 might be caught by the retainer cover 3 and might clog between the component feed guide 2 and retainer cover 3. Or the component 5 sometimes bites into the slit 6 because of vibrations and impacts, etc. during component feeding time.

As shown in FIG. 6(b), further, when the shutter 8 is opened to suck the component 5 located at the component feed port 4, in some cases, the component rises inside the component accommodating section 1c due to vibrations, shocks or the like in supplying components, whereby the component cannot be removed in a proper attitude by the suction nozzle 10. As a result, mounting errors might be occur.

SUMMARY OF THE INVENTION

The main object of the present invention is therefore to provide a component feed apparatus which can stably and speedily feed components, taking into consideration the aforementioned problems inherent in the prior art.

A component feed apparatus comprises: a component feed guide for guiding a taped component (or component tape) to be fed in one direction, said taped component including component accommodating sections storing components with a predetermined pitch in a longitudinal direction of a tape, a covering tape covering the component accommodating sections and feed holes arranged at equal intervals; a retainer cover which can cover the taped component guided by the component feed guide; a separating means which can strip the covering tape from the taped component; a feed means for intermittently sending the taped component in the one direction; and a take-up means which can take up the covering tape separated by the separating means, wherein a magnet is set to magnetically attract the components before the covering tape is separated at least at a position in front of the separating means of the component feed guide.

According to one aspect of the invention, the magnet is set in a range from a position at least in front of the separating means of the component feed guide to the vicinity of the component feed port where the component is removed by suction and taken outside, to thereby to magnetically attract the component before the covering tape is separated, while the covering tape is being separated or after the covering tape is separated.

According to another aspect of the invention, the magnet is set from a position at least in front of the separating means of the component feed guide to a position immediately under the component feed port where the component is removed by suction and taken outside, so as to magnetically attract the component before the covering tape is separated, being while the covering tape is separated or after the covering tape is separated.

according to a further aspect of the invention, the magnet has an opening through which a push pin can move for pushing the component from below upwardly through the component feed port.

BRIEF DESCRIPTION OF THE DRAWINGS

FIGS. 1(a) and (b) are is a perspective views of a component feed apparatus, and FIGS. 1(c) and (d) are a partially broken-away plan view and a side sectional view of a taped component, according to an embodiment of the present invention.

DETAILED DESCRIPTION OF THE INVENTION

According to the present invention, in a component feed apparatus for sequentially feeding components to a component feed port by moving a (or component tape) (taping-component) along a component feed guide, the component is drawn by a magnetic attraction force of a magnet before a covering tape is separated at least at a position in front of the separating means, so that the component is prevented from being pulled together with a covering tape when the covering tape is separated or from biting into the separating means due to vibrations or shocks, etc. during component feeding. The component feed apparatus is effective to supply components quickly and stably.

According to the present invention, when the magnet is set in a range from a position at least in front of the separating means of the component feed guide to the vicinity of the component feed port through which the component is removed by suction and taken outside, or when the magnet is set from a position at least in front of the separating means of the component feed guide to a position immediately under the component feed port through which the component is removed and taken outside, so as to magnetically attract the component before the covering tape is separated, while the covering tape is being separated or after the covering tape has been separated, in addition to the above operations and effects, the magnet in the vicinity of the component feed port magnetically attracts and holds the component sent to the component feed port, thereby preventing the component at the component feed port from being shifted from a proper attitude due to the influence of vibrations, etc. and stabilizing the attitude of the component. During the movement of the taped component to the component feed port along the component feed guide, the magnet magnetically attracts and holds the components in the component accommodating sections, thus contributing to safe transfer of the components until the components are sucked by a suction nozzle, and to stabilization of the attitude of components at the component feed port.

Further, according to the present invention, the component magnetically attracted by the magnet is pushed up from below when taken out by the suction nozzle, so that the component can be sucked more surely by the suction nozzle.

Preferred embodiments of the present invention will now be described with reference to FIGS. 1(a)–(d), 2, 3, and 4(a)–(e).

Embodiment 1

Figure 3:
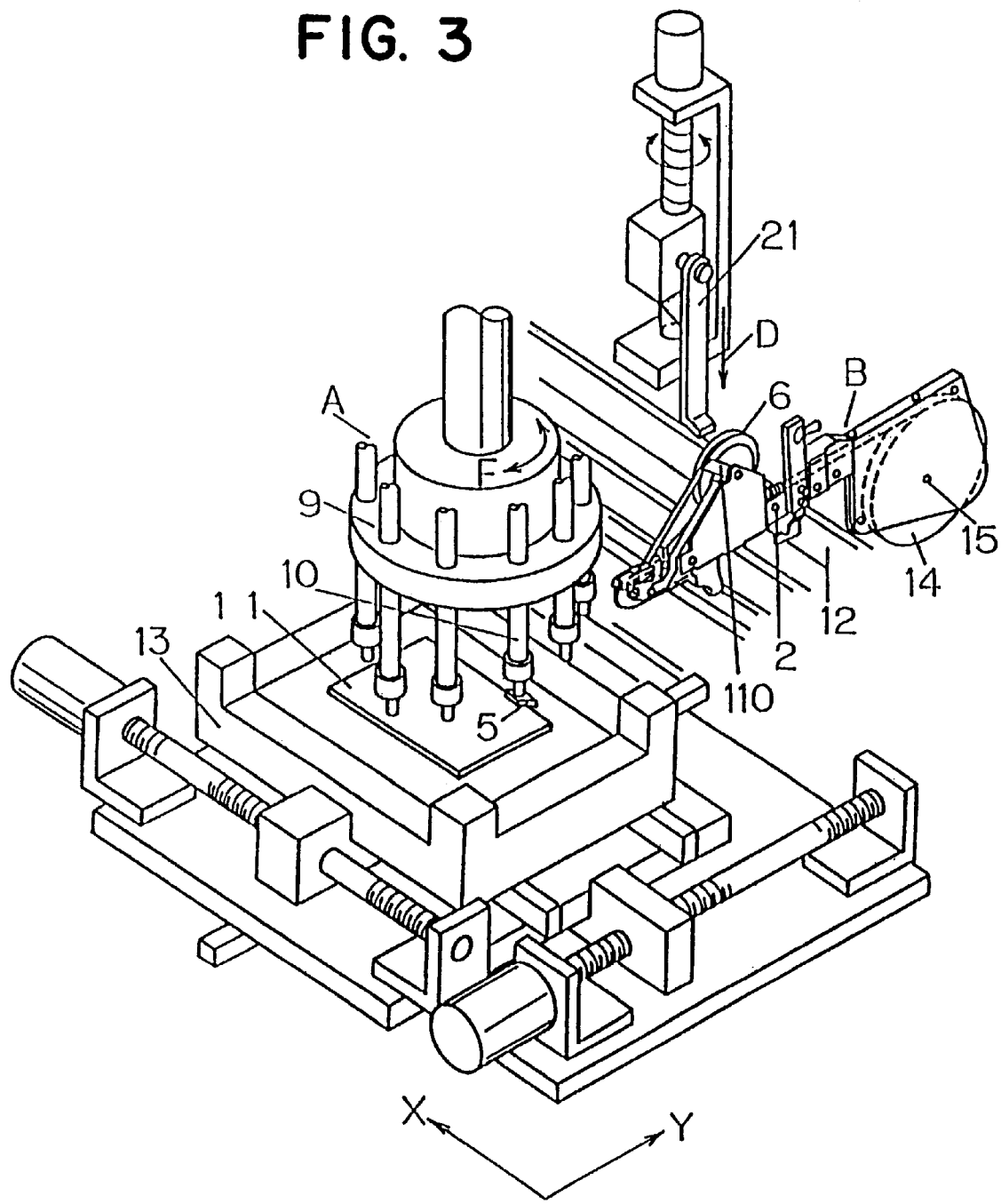
FIG. 3 is a perspective view of a mounting apparatus in use with the component feed apparatus of the present invention.

A component feed apparatus according to the embodiment shows an example which is adopted, for instance, to automatically feed a component 5 to a printed board 11 in an electronic component mounting apparatus A as shown in FIG. 3. Needless to say, however, the component feed apparatus is generally applicable to various kinds of components. A component feed table 12 is set beside the mounting apparatus A, on which component feed apparatuses B for feeding a number of types of components 5 required for the mounting apparatus A are loaded. The component feed apparatus B holding the components 5 of the required type at that time is moved to a position where it faces the mounting apparatus A, and the component 5 is sucked by a suction nozzle 10 at a component mounting head 9 of the mounting apparatus A and mounted to the printed board 11. The printed board 11 is placed on an XY table 13 which is movable in X and Y directions orthogonal to each other. The component 5 sucked by the suction nozzle 10 and carried to a mounting position under the movement control in the X and Y directions is mounted to a predetermined position on the printed board 11. At this time, the suction nozzle 10, instead of the printed board 11, can be moved in X and Y directions to mount the component 5 to the predetermined position of the printed board 11.

The component feed apparatus B stores the component 5 in a component accommodating sections 1c provided at predetermined intervals in a longitudinal direction of a tape 1a shown at FIGS. 1(c) and (d) in FIG. 1. The apparatus B handles a taped component 1 covered with a covering tape 1b. The taped component 1 is, as indicated 1(a) in FIG. 1, wound unto an accommodating reel 14 which is fitted in a rotatable and detachable fashion to a supporting shaft 15 at a rear end part of a component feed guide 2.

Referring to FIGS. 1(a)–(d) and 2, the component feed apparatus B unwinds the taped component 1 from the accommodating reel 14 along an upper face of the component feed guide 2 and moves the taped component towards a component feed port 4 in between the component feed guide 2 and a retainer cover 3 hanging over a front end part of the component feed guide 2. The component is sucked and held at the component feed port 4 formed in the retainer cover 3 to be removed therethrough.

Regarding the movement of the taped component 1, a sprocket 16 provided as a feed means at the front end part of the component feed guide 2 is meshed with feed holes id formed in the taped component 1, so that the taped component 1 is transferred by rotation of the sprocket 16. In the middle of the movement of the taped component 1, the covering tape 1b is drawn out through a slit 6 as a separating means notched from one side of the retainer cover 3 immediately in front of the component feed port 4, then separated from the tape 1a and wound unto a reel 7 as a take-up means. Although the slit notched from one side of the retainer cover 3 is used as the separating means in the present Embodiment, any constitution can be used so long as the covering tape 1b can be drawn out.

As shown in FIG. 1(a), the reel 7 is so constructed on a supporting shaft 17 above a middle part of the component feed guide 2 as to rotate only in a take-up direction of the covering tape 1b designated by an arrow C. A ratchet mechanism 19 including a ratchet gear 18 is further provided. Every time a feed lever 20 pivotally supported to the supporting shaft 17 is pressed and turned in a direction of an arrow D by an operating mechanism 21 set at a component feed position as shown in FIG. 3, the sprocket 16 is driven via a link-lever mechanism 22 and a ratchet mechanism 23 interlocking with the link-lever mechanism 22 and the reel 7 is driven via the ratchet mechanism 19 of the reel 7. In the constitution as above, one component is supplied through the movement of the taped component 1 by a predetermined distance, and simultaneously with this, the covering tape 1b is taken up by a predetermined length. Consequently, the tape 1a in a state exposing the component accommodating sections 1c subsequent to the separation of the covering tape 1b is sent to the component feed port 4.

As shown at FIGS. 1(a) and (b) in FIG. 1, a shutter 8 is provided which opens and closes the component feed port 4 of the retainer cover 3 in association with the feeding of components 5, so that the components 5 are prevented from popping out unexpectedly. The shutter 8 is movable forward and rearward by pins 24 and elongated holes 24a in a bent side wall of the retainer cover 3. A downward notch 24b of the shutter 8 is engaged with a pin 27 on a lever member 26 to which the motion of the feed lever 20 of the link-lever mechanism 22 is transmitted via a link 25, when the component feed port 4 is opened in association with the feed operation of the component 5. On the other hand, the component feed port 4 is closed when the component 5 is not supplied. In other words, the shutter 8 opens only when the component 5 is to be taken out by the suction nozzle 10 to suck the component and mount the component unto the printed board 11.

Figure 4A:
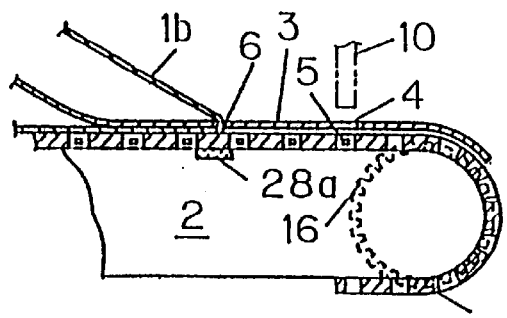
FIGS. 4(a)–(e) are is a sectional views of the component feed apparatus of the embodiment of the present invention.
Figure 5A:
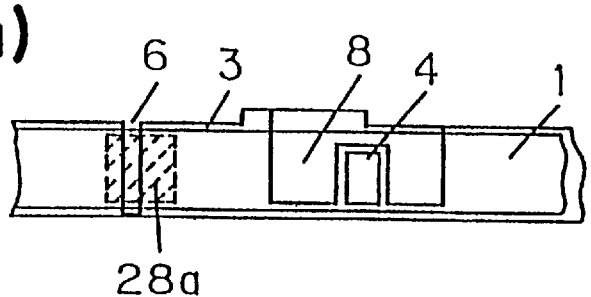
FIGS. 5(a)–(d) are is a plan views of a component feed guide according to the embodiment of the present invention.

As is clearly shown in FIGS. 4(a) and 5(a), a magnet 28a is installed in the vicinity of the slit 6 of the component feed guide 2 where the covering tape 1b is separated. The magnet 28a has enough magnetism to feed the component stably while holding an attitude of the component in accordance with a size and a mass of the component (approximately 100 gauss in the present Embodiment). Then, even if static electricity is caused between the covering tape 1b and component 5 when the covering tape 1b is taken out through the slit 6 and wound unto the reel 7, the component 5 is dragged along in accordance with the winding of the covering tape 1b, or the magnet 28a magnetically attracts the component located in the vicinity of the slit 6 to hold it even in the presence of vibrations or impacts, etc. during feeding of the components. Thus, the magnetic attraction force of the magnet 28a can prevent the component 5 from floating out of the component accommodating section 1c and clogging between the retainer cover 3 and component feed guide 2 or biting into the slit 6. The component can be accordingly supplied to the component feed port 4 quickly and stably.

In the present embodiment, the magnet 28a is arranged in the vicinity of the slit 6. However, the magnet 28a may be sheet-shaped and embedded in the component feed guide 2. Any magnetic substance is utilizable for the purpose, it is not limited to a magnet.

Figure 4B:
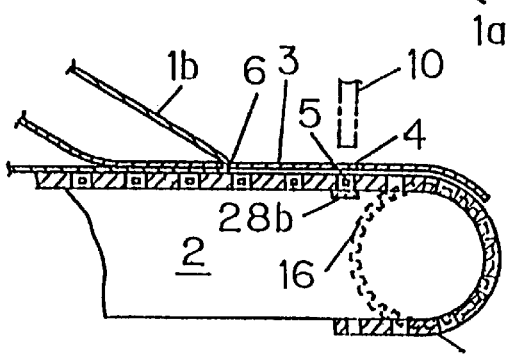
Figure 4C:
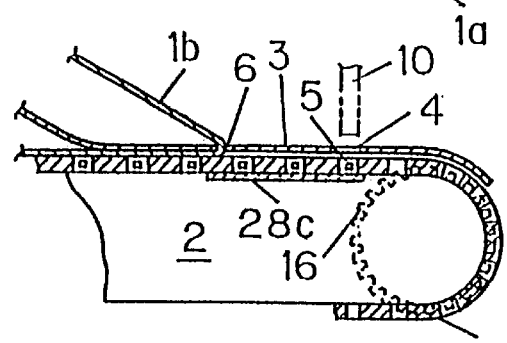
Figure 4D:
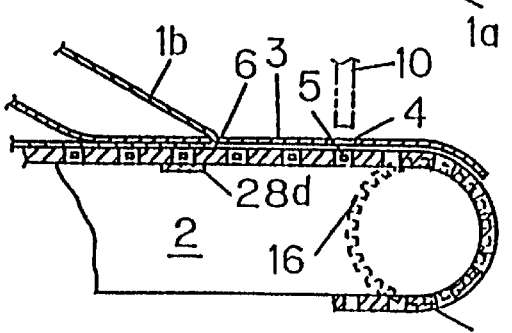
Figure 4E:
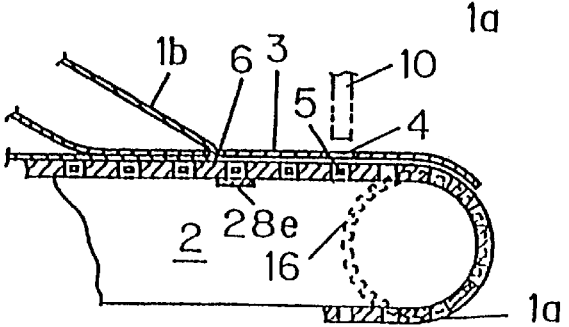

So long as the component 5 is prevented from clogging between the retainer cover 3 and component feed guide 2 or biting into the separating means 6, for example, the magnet 28d can be provided, as denoted by 28d in FIG. 4(d), at a position of the component 5 before the covering tape 1b is separated by the slit 6 as the separating means, or at a position of the component 5 immediately after the covering tape 1b is separated as represented by 28e in FIG. 4(e).

Embodiment 2

Figure 5B:
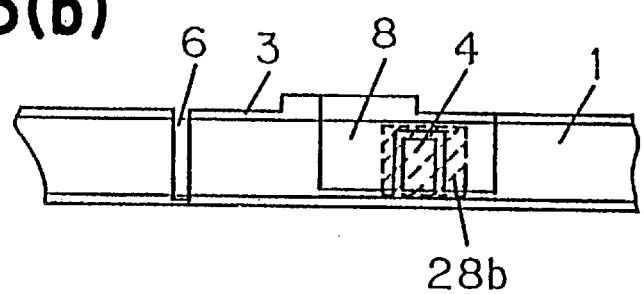

A magnet 28b is set in the vicinity of the component feed port 4 of the component feed guide 2 where the component is sucked by the suction nozzle 10, as shown in FIGS. 4(b) and 5(b). Since the component 5 located at the component feed port 4 is magnetically attracted by the magnet 28b, the component 5 can be prevented from being shifted in attitude, that is, erected upright due to vibrations or the like during feeding of components while the shutter 8 is opened and then the component is sucked by the suction nozzle 10. The component can be taken outside in a proper attitude.

Embodiment 3

Figure 5C:
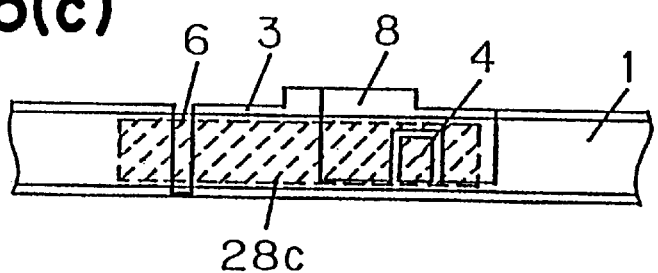

As is clear in FIGS. 4(c) and 5(c), a magnet 28c of 3 mm breadth, 20 mm length and 1 mm thickness is arranged to extend under the component feed guide 2 from the vicinity of the slit 6 where the covering tape 1b is separated to the vicinity of the component feed port 4 where the component is removed by the suction nozzle 10. The magnet 28c exerts magnetism sufficient (approximately 100 gauss in the present embodiment) to stably supply the component while maintaining the attitude of the component in accordance with a size and a mass of the component. The component 5 in the component accommodating section 1c is held by the magnetic attraction force of the magnet 28c during the transfer to the component feed port 4 along the component feed guide 2, and therefore the component 5 can be fed stably during the transfer thereof before the component is sucked by the section nozzle 10. Moreover, the component 5 is kept stable in attitude at the component feed port 4. Although nearly 70 among 10,000 components are sucked improperly by the suction nozzle 10 in the conventional apparatus, the failure can be limited to merely 0–1 according to the present embodiment. As a result, defective mounting to the printed board 11 can be avoided.

Embodiment 4

Figure 2:
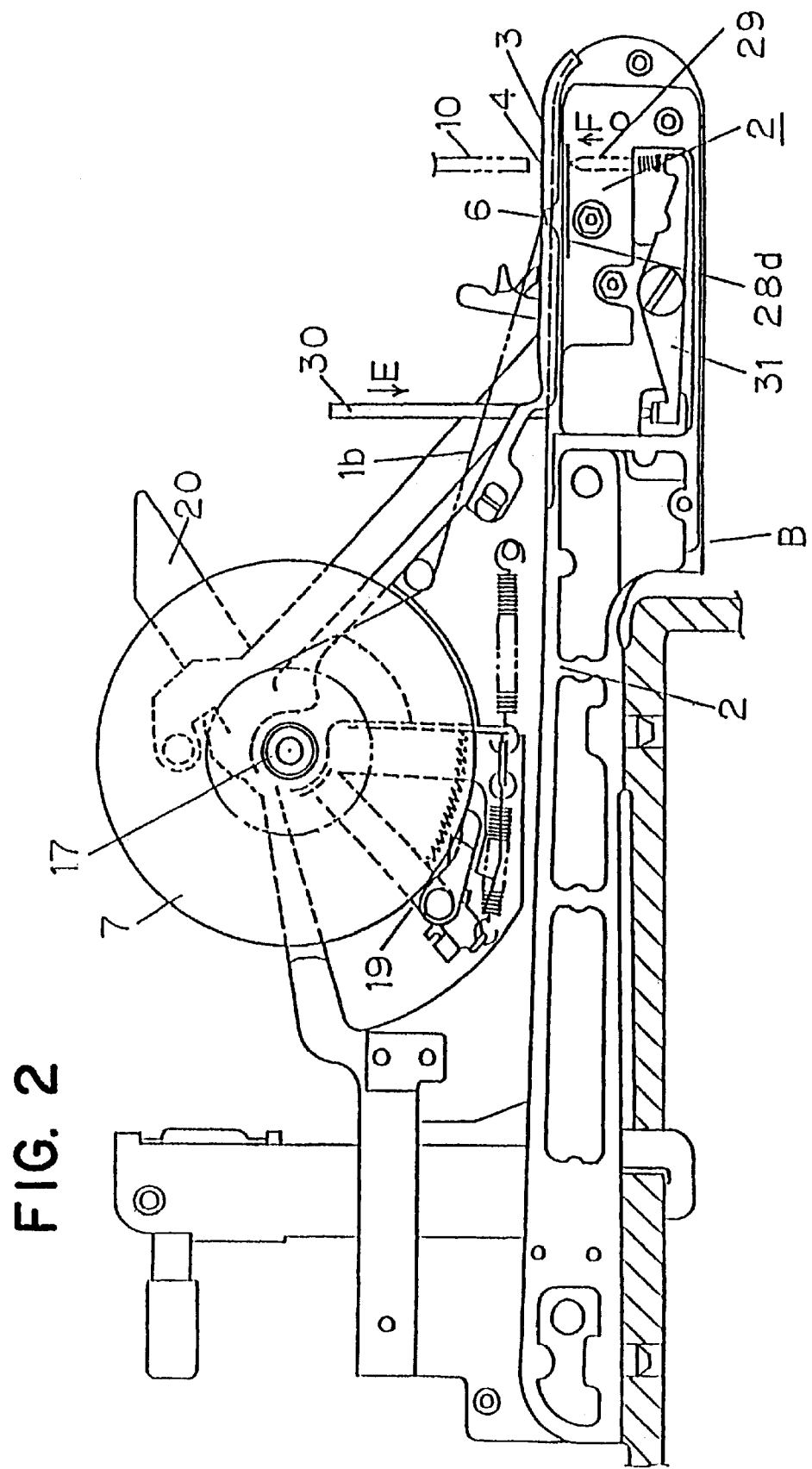
FIG. 2 is a side view of an essential portion of the component feed apparatus of the embodiment of the present invention.
Figure 5D:
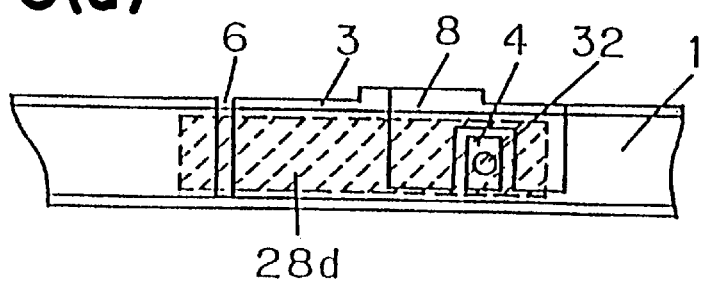
Figure 6A:
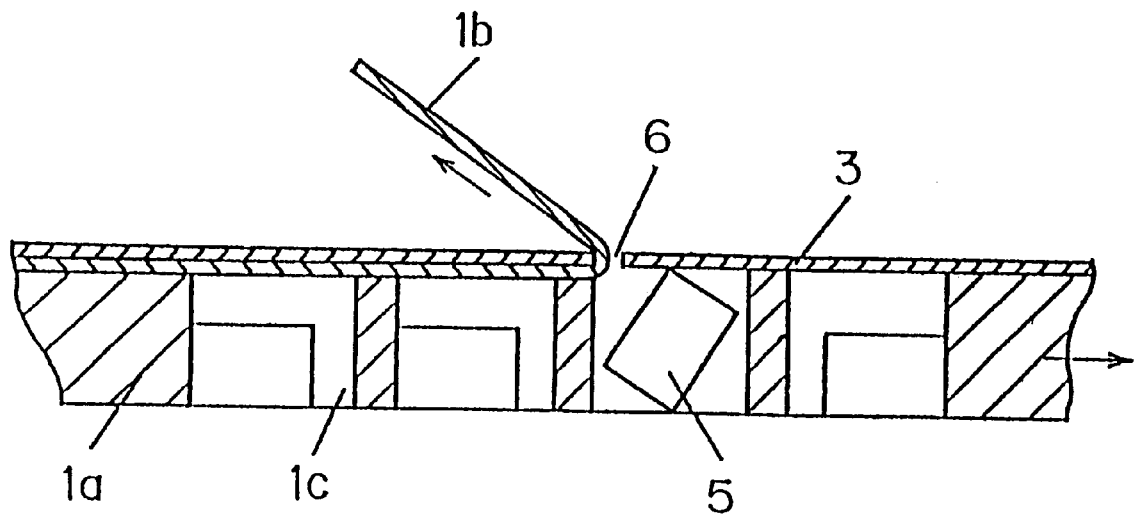
FIGS. 6(a) and (b) are is a sectional views of an essential portion of a conventional component feed apparatus.
Figure 6B:
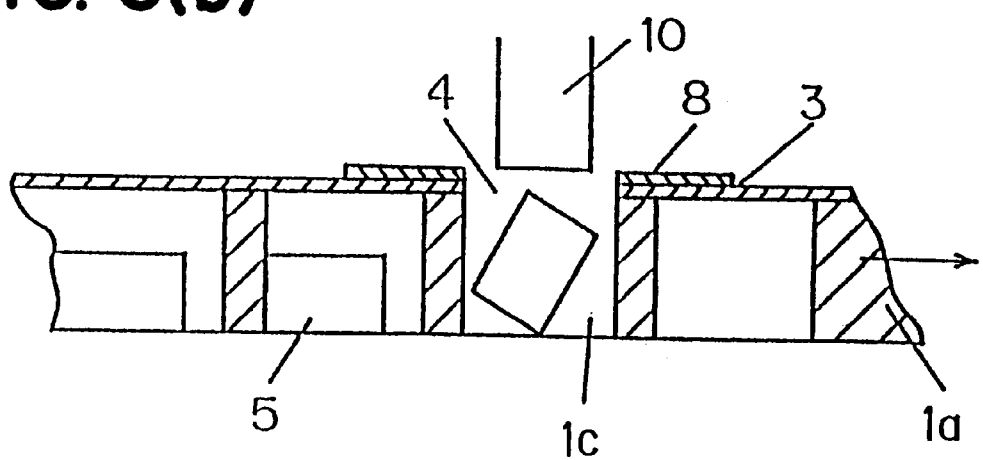

As indicated in FIG. 2, a push pin 29 is provided under the component feed port 4, which can push up the component 5 at the component feed port 4. In FIG. 5(d), a hole 32 is formed in the magnet 28d at a position corresponding to the component feed port 4. The push pin 29 can move in and out through the hole 32. When a push lever 30 is driven in a direction of an arrow E by a driving source (not illustrated), the push pin 29 is arranged to be pushed up in a direction of an arrow F from below via a link 31.

Owing to this arrangement, even if the magnetic force of the magnet 28d extending from the vicinity of the slit 6 of the component feed guide 2 to the vicinity of the component feed port 4 is so intense as to hinder the component 5 from removed by the suction nozzle 10, the component can be surely sucked by the suction nozzle 10 with the help of the push pin 29 pushing the component 5 from below. A suction rate of the components by the suction nozzle 10 is improved greatly.

While the hole 32 is provided in the present embodiment, any opening or space allowing the push pin to move in and out, for example, a square opening may be applicable. Or the magnet may be divided into parts separated by a space through which the push pin can extend.

INDUSTRIAL APPLICABILITY

As described hereinabove, according to the present invention, the component feed apparatus of the present invention comprises the component feed guide for guiding a taped component to be fed in one direction, the taped component including the component accommodating sections for storing components with a predetermined pitch in a longitudinal direction of a tape, the covering tape covering these component accommodating sections and the feed holes arranged at equal intervals, the retainer cover for covering the taped component guided by this component feed guide, the separating means which can separate the covering tape of the taped component, the feed means for intermittently sending the taped component in one direction and, the take-up means for taking up the covering tape separated by the separating means. The magnet magnetically attracts the component before the covering tape is separated at a position at least in front of the separating means of the component feed guide, so that the component can be prevented from being dragged together with the covering tape when the covering tape is separated and from biting into the separating means due to vibrations, impacts or the like during feeding of the component. The components can be supplied quickly and stably.

According to the present invention, in addition to the above-described operations and effects, when the magnet is set in a range at least from a position in front of the separating means of the component feed guide to the vicinity of the component feed port where the component is sucked and taken out or to a position immediately under the component feed port, so as to magnetically attract the component before the covering tape is separated, while the covering tape is being separated or the component after the covering tape has been separated, the magnet installed in the vicinity of the component feed port magnetically attracts and holds the component carried to the component feed port. Therefore, and therefore the component at the component feed port is prevented from being shifted from a proper attitude by the influence of vibrations, etc. The magnet effectively stabilizes the attitude of the components. During the transfer of the taped component to the component feed port along the component feed guide, the magnet magnetically attracts the components inside the component accommodating sections, enabling the stable supply of components before suction thereof by the suction nozzle and moreover stabilizing the attitude of the components at the component feed port. Accordingly, components can be taken out in a proper attitude by the suction nozzle, and eventually defective mounting to the printed board is avoided.

In the present invention, when the component attracted by the magnet is taken outside by the suction nozzle, the component is pushed up from below, and therefore the component is more surely sucked by the suction nozzle. A suction rate is hence remarkably improved.

What is claimed is:

1. A component feed apparatus for feeding a component tape including component accommodating sections storing components at a predetermined pitch in a longitudinal direction of the component tape and a covering tape covering the component accommodating sections, said component feed apparatus comprising:

a component feed guide for guiding the component tape in a component feed direction along a component feed path;

a tape feed device for intermittently feeding the component tape along the component feed path in the component feed direction;

a retainer cover for covering the component tape guided by the component feed guide;

a separating part arranged to strip the covering tape from the component tape;

a take-up part arranged to take up the covering tape separated from the component tape by said separating part; and a magnet disposed at a position to magnetically attract each component before the covering tape is separated by said separating part from the portion of the component tape accommodating the component.

2. A component feed apparatus according to claim 1, wherein said magnet is arranged so as to further magnetically attract the component while the covering tape is being separated from the component tape by said separating part.

3. A component feed apparatus according to claim 1, wherein said magnet is arranged so as to further magnetically attract the component after the covering tape has been separated from the component tape by said separating part.

4. A component feed apparatus according to claim 1, wherein said magnet is arranged below the component feed path to create a magnetic attraction tending to prevent the component from escaping from its respective component accommodating section of the component tape.

5. A component feed apparatus according to claim 1, wherein at least a portion of said magnet is located below the component feed path at a position upstream of said separating part.

6. A component feed apparatus for feeding a component tape including component accommodating sections storing components at a predetermined pitch in a longitudinal direction of the component tape and a covering tape covering the component accommodating sections, said component feed apparatus comprising:

a component feed guide for guiding the component tape in a component feed direction along a component feed path;

a tape feed device for intermittently feeding the component tape along the component feed path in the component feed direction;

a retainer cover for covering the component tape guided by the component feed guide;

a separating part arranged to strip the covering tape from the component tape;

a take-up part arranged to take up the covering tape separated from the component tape by said separating part;

wherein said component feed guide includes a component feed port at which the component is drawn and held by suction for transferring the component; and wherein a magnet is disposed at a position to magnetically attract each component before the covering tape is separated by said separating part from the portion of the component tape accommodating the component.

7. A component feed apparatus according to claim 6, wherein said magnet is disposed immediately under said component feed port of said component feed guide.

8. A component feed apparatus according to claim 7, wherein said magnet has an opening through which a push pin can be inserted and withdrawn to push the component up from below at said component feed port.

9. A component feed apparatus according to claim 7, further comprising a push pin for pushing the component up from below at said component feed port; and wherein said magnet has an opening through which said push pin can be inserted and withdrawn to push the component up from below at said component feed port.

10. A component feed apparatus according to claim 6, wherein said magnet has an opening through which a push pin can be inserted and withdrawn to push the component up from below at said component feed port.

11. A component feed apparatus according to claim 6, further comprising a push pin for pushing the component up from below at said component feed port; and wherein said magnet has an opening through which said push pin can be inserted and withdrawn to push the component up from below at said component feed port.

12. A component feed apparatus for feeding a component tape including component accommodating sections storing components at a predetermined pitch in a longitudinal direction of the component tape and a covering tape covering the component accommodating sections, said component feed apparatus comprising:

a component feed guide for guiding the component tape in a component feed direction along a component feed path;

a tape feed device for intermittently feeding the component tape along the component feed path in the component feed direction;

a retainer cover for covering the component tape guided by the component feed guide;

a separating part arranged to strip the covering tape from the component tape;

a take-up part arranged to take up the covering tape separated from the component tape by said separating part;

wherein said component feed guide includes a component feed port at which the component is drawn and held by suction for transferring the component; and wherein a magnet is disposed at a position to magnetically attract each component before the covering tape is separated by said separating part from the portion of the component tape accommodating the component, and said magnet extends at least from said position to a vicinity of said component feed port of said component feed guide.

13. A component feed apparatus according to claim 12, wherein said magnet has an opening through which a push pin can be inserted and withdrawn to push the component up from below at said component feed port.

14. A component feed apparatus according to claim 12, further comprising a push pin for pushing the component up from below at said component feed port; and wherein said magnet has an opening through which said push pin can be inserted and withdrawn to push the component up from below at said component feed port.

* * * * *